(12) United States Patent
Iyengar et al.

(10) Patent No.: US 7,950,244 B2
(45) Date of Patent: May 31, 2011

(54) APPARATUS FOR FACILITATING COOLING OF AN ELECTRONICS RACK THROUGH THE USE OF AN AIR-TO-LIQUID HEAT EXCHANGER

(75) Inventors: Madhusudan K. Iyengar, Woodstock, NY (US); Roger R. Schmidt, Poughkeepsie, NY (US); Howard P. Welz, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 765 days.

(21) Appl. No.: 11/939,650

(22) Filed: Nov. 14, 2007

(65) Prior Publication Data
US 2009/0122488 A1    May 14, 2009

(51) Int. Cl.
*F25D 23/12* (2006.01)
(52) U.S. Cl. ...... 62/259.2; 62/259.1; 361/699; 361/700; 165/80.4; 24/19
(58) Field of Classification Search ............... 62/259.1, 62/259.2; 361/699, 700; 165/80.4; 24/19
See application file for complete search history.

(56) References Cited

U.S. PATENT DOCUMENTS

| | | | |
|---|---|---|---|
| 4,011,905 A | 3/1977 | Millard | |
| 5,467,250 A | 11/1995 | Howard et al. | |
| 6,164,369 A | 12/2000 | Stoller | |
| 6,462,944 B1 | 10/2002 | Lin | |
| 6,535,382 B2 | 3/2003 | Bishop et al. | |
| 6,760,221 B2 | 7/2004 | Goth et al. | |
| 6,775,137 B2 | 8/2004 | Chu et al. | |
| 6,819,563 B1 | 11/2004 | Chu et al. | |
| 7,074,123 B2 | 7/2006 | Bettridge et al. | |
| 7,086,247 B2 | 8/2006 | Campbell et al. | |
| 7,365,973 B2 * | 4/2008 | Rasmussen et al. | 361/694 |
| 7,385,810 B2 | 6/2008 | Chu et al. | |

(Continued)

OTHER PUBLICATIONS

"RackCooler"—A Cool Solution for X-Treme Density Rack Enclosure Systems, Liebert Corporation, Product Brochure, 8 pgs. (2001).
Teague, Paul E., "One Cool Machine", Design News for Mechanical and Design Engineers, Internet Article, 6 pgs. (Feb. 7, 2005).

(Continued)

*Primary Examiner* — Cheryl J Tyler
*Assistant Examiner* — Jonathan Koagel
(74) *Attorney, Agent, or Firm* — Dennis Jung, Esq.; Kevin P. Radigan, Esq.; Heslin Rothenberg Farley & Mesiti P.C.

(57) ABSTRACT

An apparatus for facilitating cooling of an electronics rack is provided. The apparatus includes an air-to-liquid heat exchanger and system coolant inlet and outlet plenums mounted to a door of an electronics rack. The inlet and outlet plenums are in fluid communication with the heat exchanger and respectively include a coolant inlet and coolant outlet in the top portions thereof. System coolant supply and return hoses are disposed above the electronics rack and respectively couple in fluid communication the inlet plenum to a system coolant supply header and the outlet plenum to a system coolant return header. The hoses are each flexible, partially looped and of sufficient length to allow for opening and closing of the door. Stress-relief structures are coupled to at least one end of the hoses to relieve stress on the ends of the hoses during opening or closing of the door.

20 Claims, 12 Drawing Sheets

U.S. PATENT DOCUMENTS

| | | |
|---|---|---|
| 7,403,391 B2 | 7/2008 | Germagian et al. |
| 2004/0177948 A1 | 9/2004 | Cho et al. |
| 2005/0231913 A1 | 10/2005 | Malone et al. |
| 2005/0243514 A1 | 11/2005 | Malone et al. |
| 2006/0141921 A1 | 6/2006 | Turek et al. |
| 2006/0232945 A1 | 10/2006 | Chu et al. |
| 2008/0232069 A1 | 9/2008 | Chu et al. |

OTHER PUBLICATIONS

Porter et al., "Vapor-Compression Heat Exchange System with Evaporator Coil Mounted to Outlet Door Cover of an Electronics Rack", U.S. Appl. No. 11/360,634, filed Sep. 25, 2007.

Office Action for U.S. Appl. No. 11/108,306 (U.S. Letters Patent No. 7,385,810 B2), dated Sep. 20, 2007.

* cited by examiner

US 7,950,244 B2

APPARATUS FOR FACILITATING COOLING OF AN ELECTRONICS RACK THROUGH THE USE OF AN AIR-TO-LIQUID HEAT EXCHANGER

TECHNICAL FIELD

The present invention relates in general to apparatuses and methods for facilitating cooling of rack-mounted assemblages of individual electronics units, such as rack-mounted computer server units.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the computer center.

In many large server applications, processors along with their associated electronics (e.g., memory, disk drives, power, etc.) are packaged in removable drawer configurations stacked within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, through the use of a more powerful air moving device or by increasing the rotational speed (i.e., RPMs) of an existing air moving device. However, this approach is becoming problematic at the rack level in the context of a computer installation (e.g., data center).

The sensible heat load carried by the air exiting the rack is stressing the ability of the room air conditioning to effectively handle the load. This is especially true for large installations with "server farms" or large banks of computer racks close together. In such installations not only will the room air conditioning be challenged, but the situation may also result in re-circulation problems with some fraction of the "hot" air exiting one rack unit being drawn into the air inlet of the same rack or a nearby rack. This re-circulating flow is often extremely complex in nature, and can lead to significantly higher rack inlet temperatures than expected. This increase in cooling air temperature may result in components exceeding their allowable operating temperature or in a reduction in long term reliability of the components.

SUMMARY OF THE INVENTION

The shortcomings of the prior art are overcome and additional advantages are provided through the provision of an apparatus for facilitating cooling of an electronics rack. The apparatus includes an air-to-liquid heat exchanger mounted to a door of an electronics rack. The door is vertically, hingedly mounted along one edge to the electronics rack at one of an air inlet or air outlet side thereof, wherein air moves through the electronics rack from the air inlet side to the air outlet side. The apparatus further includes a system coolant inlet plenum and a system coolant outlet plenum mounted to the door adjacent to the one edge of the door hingedly mounted to the electronics rack. The system coolant inlet plenum and system coolant outlet plenum are in fluid communication with the air-to-liquid heat exchanger and facilitate passage of the system coolant therethrough. The system coolant inlet plenum includes a coolant inlet at a top portion thereof and the system coolant outlet plenum includes a coolant outlet at a top portion thereof. The apparatus further includes a system coolant supply hose and a system coolant return hose disposed above the electronics rack. The system coolant supply hose is coupled at a first end to the coolant inlet of the system coolant inlet plenum and at a second end to a system coolant supply header of the data center containing the electronics rack. The system coolant return hose is coupled at a first end to the coolant outlet of the system coolant outlet plenum and at a second end to a system coolant return header of the data center. The system coolant supply and return hoses are each flexible, at least partially looped and of sufficient length to allow for opening and closing of the door. The apparatus further includes a first stress-relief structure and a second stress-relief structure. The first stress-relief structure is coupled to the system coolant supply hose adjacent to the first end thereof, and the second stress-relief structure is coupled to the system coolant return hose adjacent to the first end thereof. The first and second stress-relief structures relieve stress on the first ends of the system coolant supply and return hoses, respectively, during opening or closing of the door.

In another aspect, a cooled electronics system is provided which includes an electronics rack and a cooling apparatus for facilitating cooling of the electronics rack. The electronics rack includes: an air inlet side and an air outlet side, with the air inlet and air outlet sides respectively enabling ingress and egress of external air; at least one electronics subsystem requiring cooling; at least one air-moving device, the at least one air-moving device being capable of causing external air to flow from the air inlet side of the electronics rack, across the at least one electronics subsystem, to the air outlet side of the electronics rack; and an outlet door hingedly mounted along one edge to the electronics rack at the air outlet side of the electronics rack, wherein the outlet door has an opening therein allowing egress of air from the electronics rack. The cooling apparatus includes an air-to-liquid heat exchanger mounted to the door within the opening so that at least a portion of air egressing from the electronics rack passes across the air-to-liquid heat exchanger, and a system coolant inlet plenum and a system coolant outlet plenum mounted to the door adjacent to the one edge of the door hingedly mounted to the electronics rack. The system coolant inlet plenum and system coolant outlet plenum are in fluid communication with the air-to-liquid heat exchanger and facilitate passage of system coolant therethrough. The system coolant inlet plenum includes a coolant inlet at a top portion thereof and the system coolant outlet plenum includes a coolant outlet at a top portion thereof. The cooling apparatus further includes a system coolant supply hose and system coolant return hose disposed above the electronics rack. The system coolant supply hose is coupled at a first end to the coolant inlet of the system coolant inlet plenum and at a second end to a system coolant supply header of a data center containing the electronics rack. The system coolant return hose is coupled at a first end to the coolant outlet of the system coolant outlet plenum and at a second end to a system coolant return header of the data center. The system coolant supply hose and the system coolant return hose are each flexible, at least partially looped and of sufficient length to allow for opening and closing of the door. The cooling apparatus further includes a first stress-relief structure coupled to the system coolant supply hose adjacent to the first end thereof, and a second stress-relief structure coupled to the system coolant return hose adjacent to the first end thereof. The first and second stress-relief structures relieve stress on the first ends of the system coolant supply and return hoses, respectively, during opening or closing of the door.

In a further aspect, a data center is provided which includes a plurality of electronics racks and a plurality of cooling apparatuses. Each electronics rack includes an air inlet side and an air outlet side, with the air inlet and air outlet sides respectively enabling ingress and egress of external air through the electronics rack. Each electronics rack further includes a door hingedly mounted along one edge to one of the air inlet side or air outlet side of the electronics rack. Each cooling apparatus is mounted in part to the door of a respective electronics rack, and includes an air-to-liquid heat exchanger mounted to the door, and system coolant inlet and outlet plenums mounted to the door adjacent to the one edge of the door hingedly mounted to the electronics rack. The system coolant inlet and outlet plenums are each in fluid communication with the air-to-liquid heat exchanger for facilitating passage of system coolant therethrough. The system coolant inlet plenum includes a coolant inlet at a top portion thereof and the system coolant outlet plenum includes a coolant outlet at a top portion thereof. The apparatus further includes a system coolant supply hose and a system coolant return hose disposed above the electronics rack. The system coolant supply hose is coupled at a first end to the coolant inlet of the system coolant inlet plenum and at a second end to a system coolant supply header of the data center. The system coolant return hose is coupled at a first end to the coolant outlet of the system coolant outlet plenum and at a second end to a system coolant return header of the data center. The system coolant supply and return hoses are each flexible, at least partially looped and of sufficient length to allow for opening and closing of the door. The apparatus further includes a first stress-relief structure coupled to the system coolant supply hose adjacent to the first end thereof, and a second stress relief structure coupled to the system coolant return hose adjacent to the first end thereof. The first and second stress-relief structures relieve stress on the first ends of the system coolant supply and return hoses, respectively, during opening or closing of the door.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
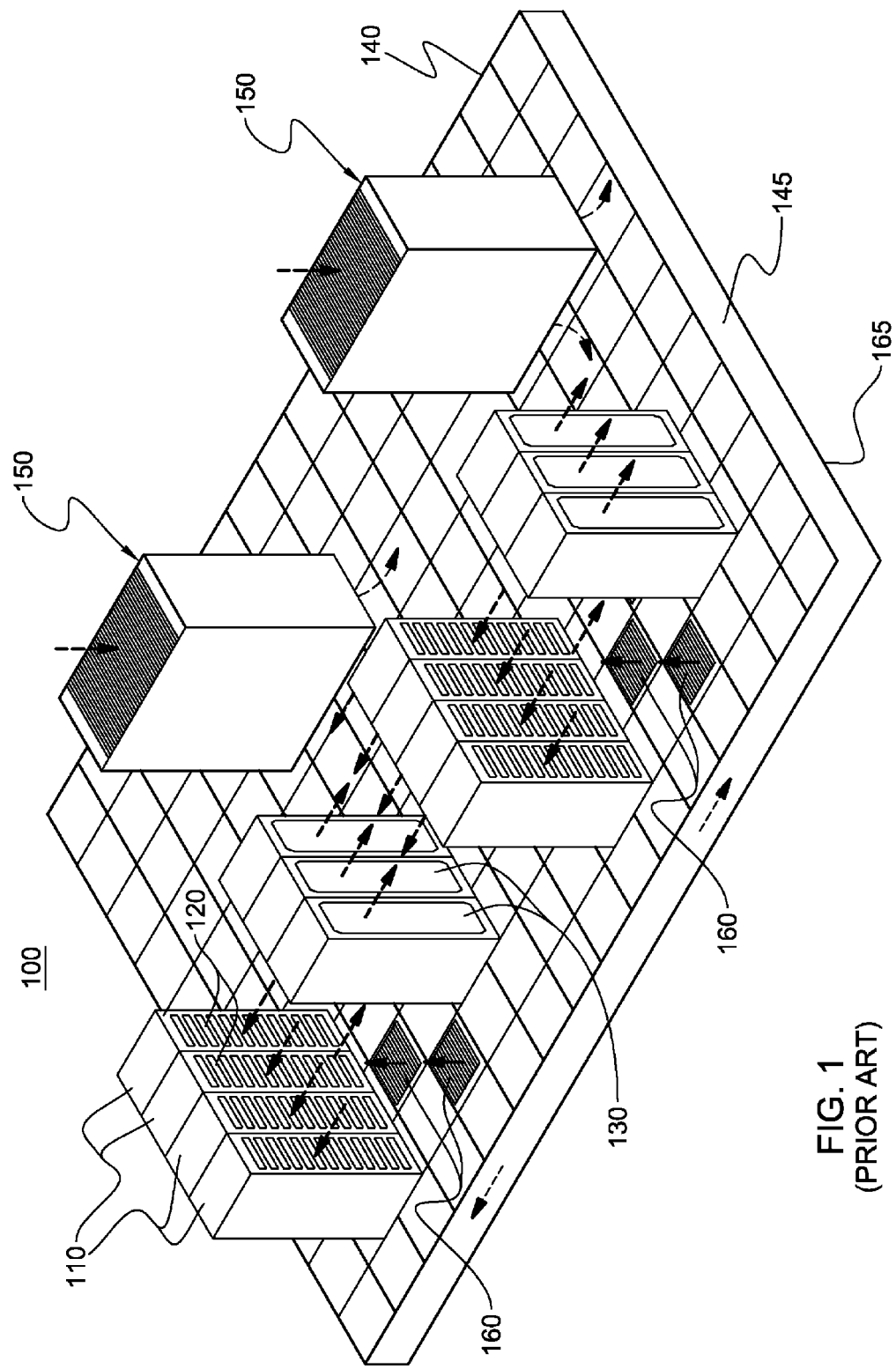
FIG. 1 depicts one embodiment of a conventional raised floor layout of an air cooled data center.

As used herein, the terms "electronics rack", "rack-mounted electronic equipment", and "rack unit" are used interchangeably, and include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems or drawers each having one or more heat generating components disposed therein requiring cooling. "Electronics subsystem" refers to any sub-housing, blade, book, drawer, node, compartment, etc., having one or more heat generating electronics components disposed therein. Electronics subsystems of an electronics rack may be movable or fixed relative to the electronics rack, with the rack-mounted electronics drawers and blades of a blade center system being two examples of subsystems of an electronics rack to be cooled.

'Further, as used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal communication with a plurality of air-cooled cooling fins. Size, configuration and construction of the air-to-liquid heat exchanger can vary without departing from the scope of the invention disclosed herein. A "liquid-to-liquid heat exchanger" comprises, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may contain one or more rows of rack-mounted computing units, such as server units.

One example of facility coolant discussed below is water, and one example of system coolant employed in the air-to-liquid heat exchanger is a two-phase refrigerant, such as R245a, R22, R410a, R12, R125, R290, R744, 134A refrigerant, Novec 700 (offered by 3M Corporation of St. Paul, Minn.), 3M's Novec 7200, 3M's Novec 649, 3M's FC86, Galden HT-20 (offered by Solvay Solexis, of Brussels). However, the concepts disclosed herein are readily adapted to use with other types of liquid coolant. For example, one or more of the coolants may comprise a dielectric liquid, hydrofluorocarbon (HFC), chlorofluorocarbon (CFC), hydrochlorofluorocarbons (HCFC), a fluorocarbon liquid, a fluoroinert liquid, a liquid metal, water, a brine, or other similar coolant, while still maintaining the advantages and unique features of the present invention. Thus, although the facility coolant is described hereinbelow as water and the system coolant is described a two-phase refrigerant, these are examples only.

Reference is made below to the drawings, which are not drawn to scale for reasons understanding, wherein the same reference numbers used throughout different figures designate the same or similar components.

As shown in FIG. 1, in a raised floor layout of an air cooled computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have an air moving device (e.g., fan or blower) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more conditioned air units 150, also disposed within the computer installation 100. Room air is taken into each conditioned air unit 150 near an upper portion thereof. This room air comprises in part exhausted air from the "hot" air aisles of the data center defined by opposing air outlet sides 130 of the electronics racks 110.

Figure 2:
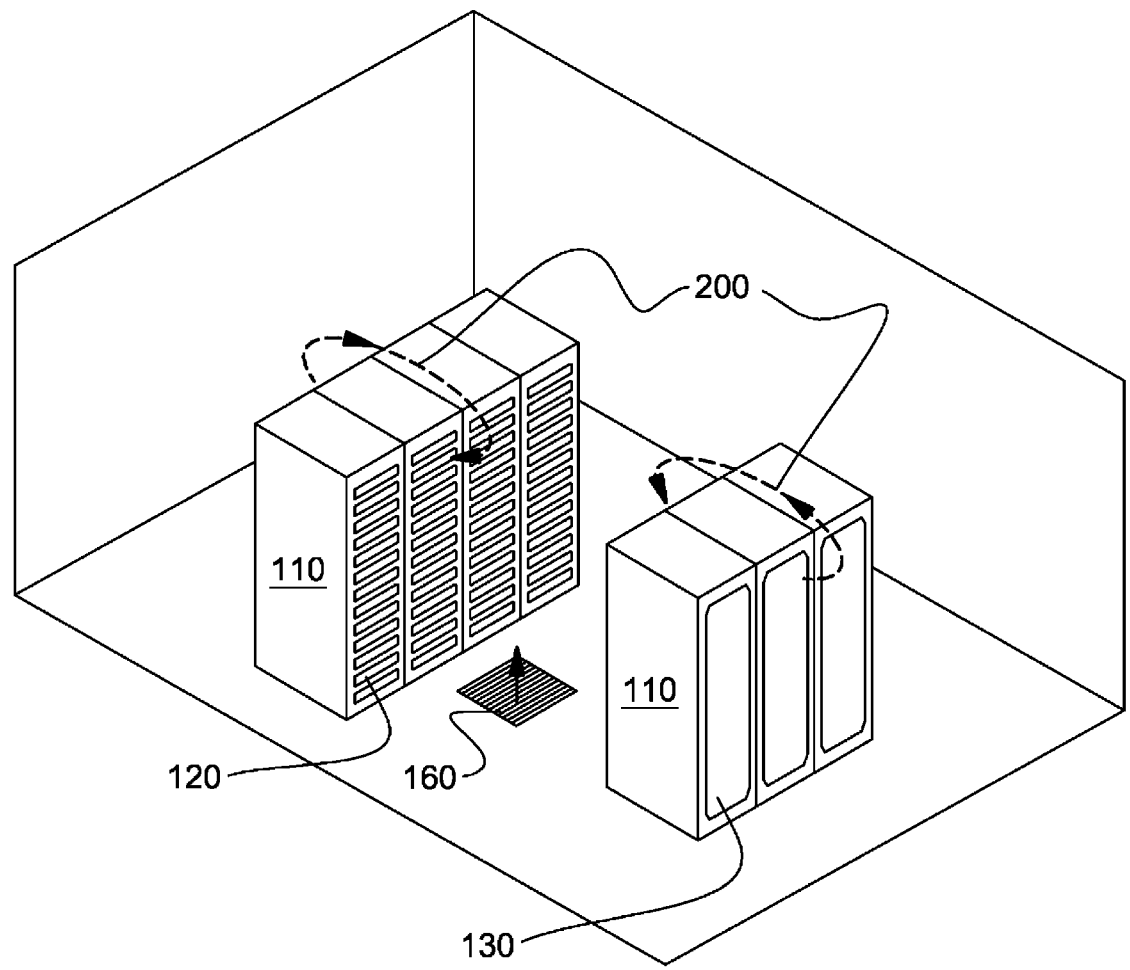
FIG. 2 depicts one problem addressed by the present invention, showing recirculation air flow patterns in one implementation of a raised floor layout of an air cooled data center.

Due to the ever increasing air flow requirements through electronics racks, and limits of air distribution within the typical computer room installation, recirculation problems within the room may occur. This is shown in FIG. 2 for a raised floor layout, wherein hot air recirculation 200 occurs from the air outlet sides 130 of the electronics racks back to the cold air aisle defined by the opposing air inlet sides 120 of the electronics rack. This recirculation can occur because the conditioned air supplied through tiles 160 is typically only a fraction of the air flow rate forced through the electronics racks by the air moving devices disposed therein. This can be due, for example, to limitations on the tile sizes (or diffuser flow rates). The remaining fraction of the supply of inlet side air is often made up by ambient room air through recirculation 200. This recirculating flow is often very complex in nature, and can lead to significantly higher rack unit inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 1, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to an inefficient utilization of available air conditioning capability. computer installation equipment almost always represents a high capital investment to the customer. Thus, it is of significant importance, from a product reliability and performance view point, and from a customer satisfaction and business perspective, to achieve a substantially uniform temperature across the air inlet side of the rack unit. The efficient cooling of such computer and electronic systems, and the amelioration of localized hot air inlet temperatures to one or more rack units due to recirculation of air currents, are addressed by the apparatuses and methods disclosed herein.

Figure 3:
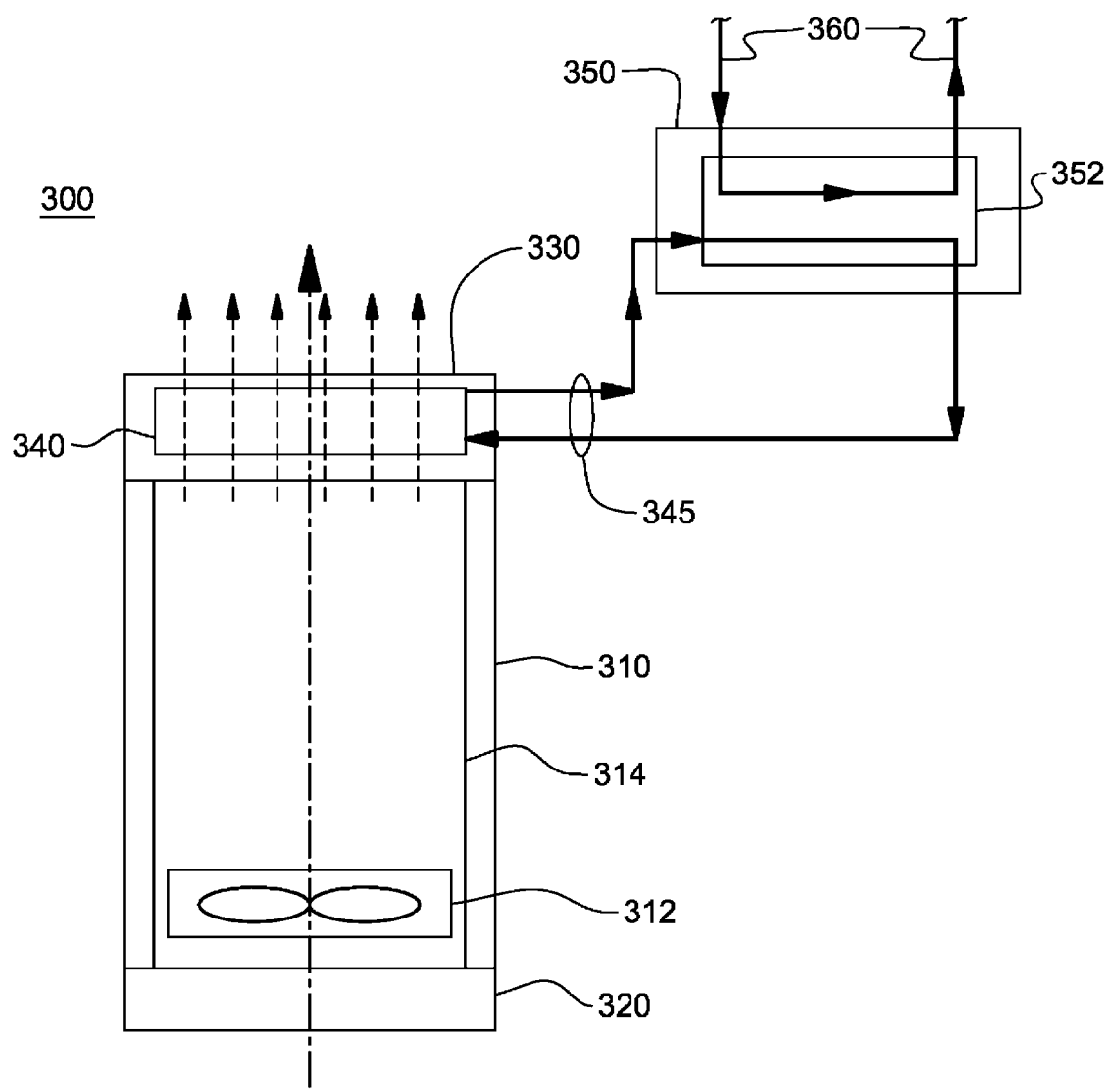
FIG. 3 is a top plan view of one embodiment of an electronics rack with an air-to-liquid heat exchanger mounted to an outlet door thereof, in accordance with an aspect of the present invention.

FIG. 3 depicts one embodiment of a cooled electronics system, generally denoted 300, in accordance with an aspect of the present invention. In this embodiment, electronics system 300 includes an electronics rack 310 having an inlet door 320 and an outlet door 330, which respectively have openings to allow for the ingress and egress of external air, respectively, through the air inlet side and air outlet side of electronics rack 310. The system further includes at least one air-moving device 312 for moving external air across at least one electronics subsystem 314 positioned within the electronics rack. Disposed within outlet door 330 is an air-to-liquid heat exchanger 340 across which the inlet-to-outlet airflow through the electronics rack passes. A cooling unit 350 is used to buffer the air-to-liquid heat exchanger from facility coolant 360, for example, provided via a computer room water-conditioning unit (not shown). Air-to-liquid heat exchanger 340 removes heat from the exhausted inlet-to-outlet airflow through the electronics rack via the system coolant, for ultimate transfer in cooling unit 350 to facility coolant 360 via liquid-to-liquid heat exchanger 352 disposed therein. This cooling apparatus advantageously reduces heat load on existing air-conditioning units within the data center, and facilitates cooling of electronics racks by cooling the air egressing from the electronics rack and thus cooling any air recirculating to the air inlet side thereof.

As shown in FIG. 3, a system coolant loop 345 couples air-to-liquid heat exchanger 340 to cooling unit 350. In one embodiment, the system coolant employed is water. By way of example, such a system is described in co-pending U.S. patent application entitled "Apparatus and Method for Facilitating Cooling of an Electronics Rack Employing a Heat Exchange Assembly Mounted to an Outlet Door Cover of the Electronics Rack", published Oct. 19, 2006 as U.S. Patent Publication No. 2006/0232945 A1.

In this co-pending application, the inlet and outlet plenums mount within the door and are coupled to supply and return manifolds disposed beneath a raised floor. Presented hereinbelow are enhanced variations on such an outlet door heat exchanger. Specifically, disclosed hereinbelow is an air-to-liquid heat exchanger which employs a pumped refrigerant as the system coolant. Connection hoses for the pumped refrigerant system are, in one embodiment, metal braided hoses, and the system coolant supply and return headers for the pumped refrigerant system are mounted overhead relative to the electronics racks within the data center. Thus, for the pumped refrigerant system described below, system coolant enters and exits the respective system coolant inlet and outlet plenums at the top of the door and rack, near the hinge point of where the door connects to the electronics rack. Further, because pumped refrigerant is employed, the hose and couplings used in the pumped refrigerant systems described below are affixed at both ends, i.e., to the system coolant plenums on one end and to the overhead supply and return headers on the other end.

Advantageously, the coolant supply and return hoses disclosed herein reside over the electronics rack, are flexible, at least partially looped and are sized to facilitate opening and closing of the door containing the air-to-liquid heat exchanger. Additionally, structures are provided at the ends of the hoses to relieve stress at the hose ends which results from opening or closing of the door.

Figure 4:
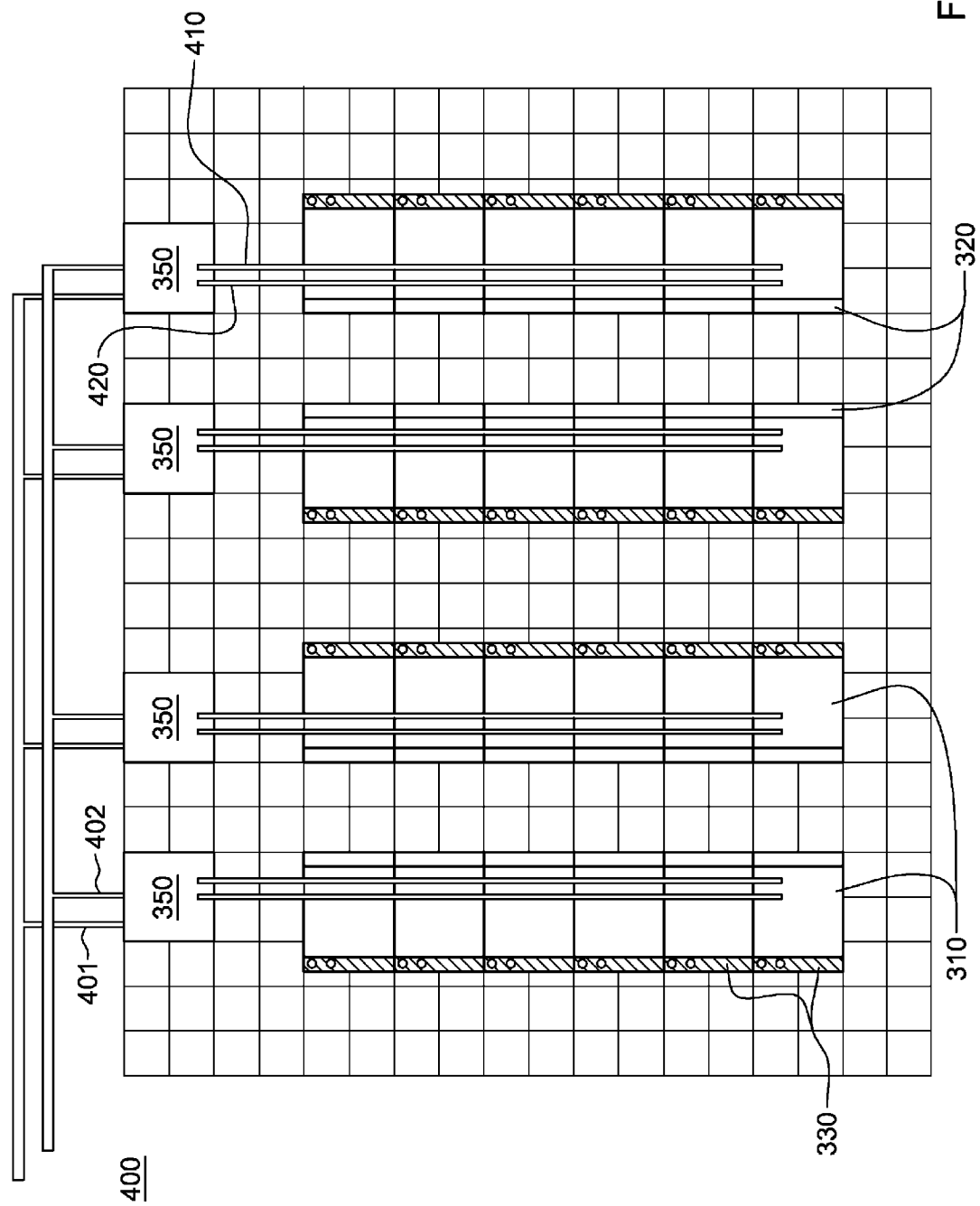
FIG. 4 is a top plan view of one embodiment of a data center employing cooling apparatuses comprising outlet door air-to-liquid heat exchangers, in accordance with an aspect of the present invention.

FIG. 4 is a plan view of one embodiment of a data center, generally denoted 400, employing cooled electronics systems, in accordance with an aspect of the present invention. Data center 400 includes a plurality of rows of electronics racks 310, each of which includes an inlet door 320 and a hinged outlet door 330, such as described above in connection with the embodiment of FIG. 3. Each outlet door 330 supports an air-to-liquid heat exchanger and system coolant inlet and outlet plenums as described further hereinbelow. Multiple cooling units 350, referred to hereinbelow as pumping units, are disposed within the data center (along with one or more air-conditioning units (not shown)). In this embodiment, each pumping unit forms a system coolant distribution subsystem with one row of a plurality of electronics racks. Each pumping unit includes a liquid-to-liquid heat exchanger where heat is transferred from a system coolant loop to a facility coolant loop. Chilled facility coolant, such as water, is received via facility coolant supply line 401, and is returned via facility coolant return line 402. System coolant, such as refrigerant, is provided via a system coolant supply header 410 extending over the respective row of electronics racks, and is return via a system coolant return header 420 also extending over the respective row of electronics racks. In one embodiment, the system coolant supply and return headers 410, 420 are hard-plumbed within the data center, and preconfigured to align over and include branch lines extending towards electronics racks of a respective row of electronics racks.

Figure 5:
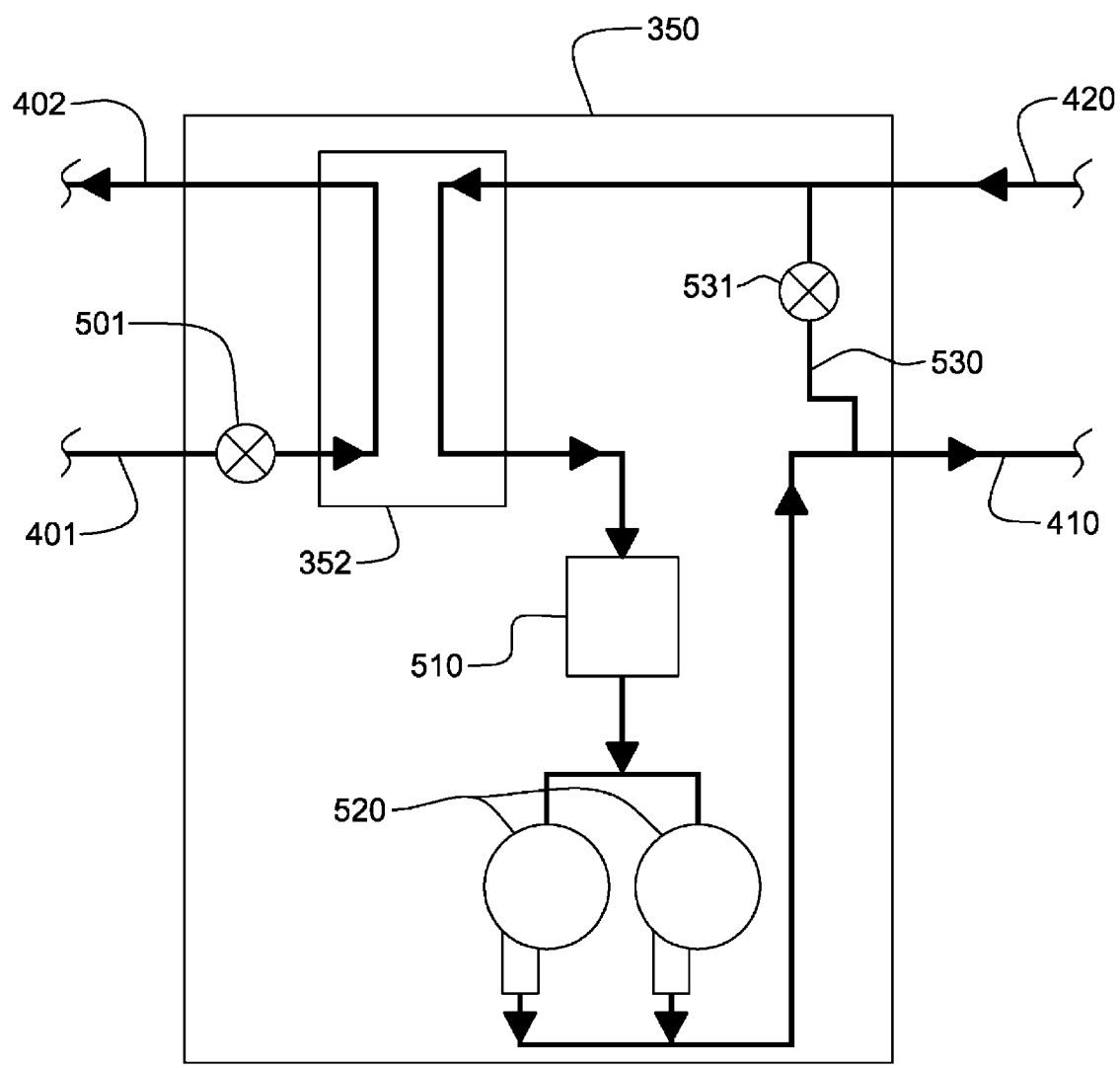
FIG. 5 is a schematic of one embodiment of a cooling unit to be used in the data center of FIG. 4, in accordance with an aspect of the present invention.

FIG. 5 depicts one embodiment of a cooling unit 350 for the data center 400 of FIG. 4. Liquid-to-liquid heat exchanger 352 condenses a vapor-liquid refrigerant mixture passing through the system coolant loop comprising system coolant supply header 410 and system coolant return header 420. (In one embodiment, the system coolant has undergone heating and partial vaporization within the respective air-to-liquid heat exchangers disposed within the outlet doors of the electronics racks.) The facility coolant loop of liquid-to-liquid heat exchanger 352 comprises facility coolant supply line 401 and facility coolant return line 402, which in one embodiment, provide chilled facility water to the liquid-to-liquid heat exchanger. A control valve 501 may be employed in facility coolant supply line 401 to control facility coolant flow rate through the liquid-to-liquid heat exchanger 352. After the vapor-liquid refrigerant mixture condenses within liquid-to-liquid heat exchanger 352, the condensed refrigerant is collected in a condensate reservoir 510 for pumping via a redundant pump assembly 520 back to the respective row of electronics racks via system coolant supply header 410. As shown in FIG. 5, a bypass line 530 with a bypass valve 531 may be employed to control the amount of system coolant fed back through the system coolant supply header, and hence, control temperature of system coolant delivered to the respective air-to-liquid heat exchangers mounted to the doors of the electronics racks.

Figure 6:
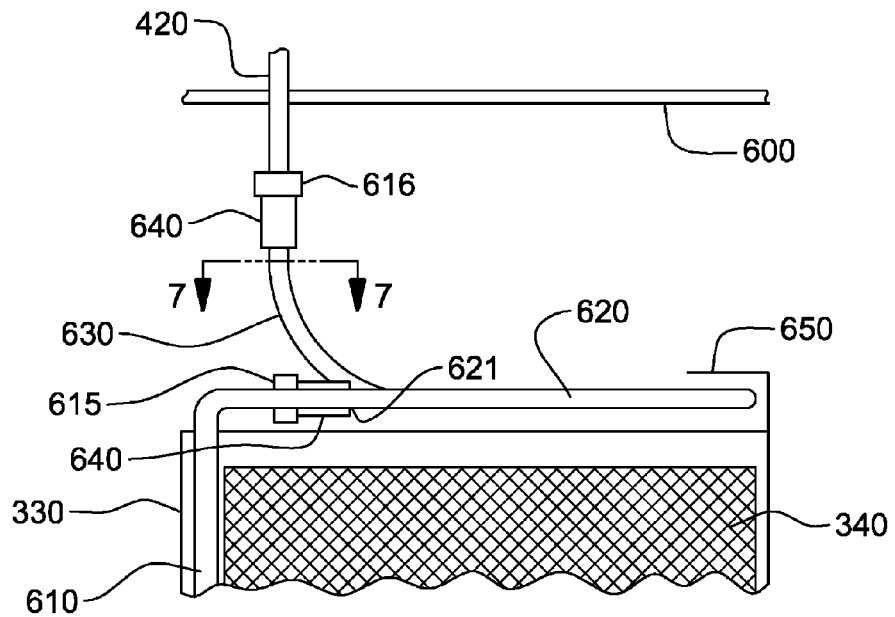
FIG. 6 is a partial cross-sectional elevational view of one embodiment of an electronics rack and cooling apparatus, taken along line 6-6 in FIG. 7, in accordance with an aspect of the present invention.
Figure 7:
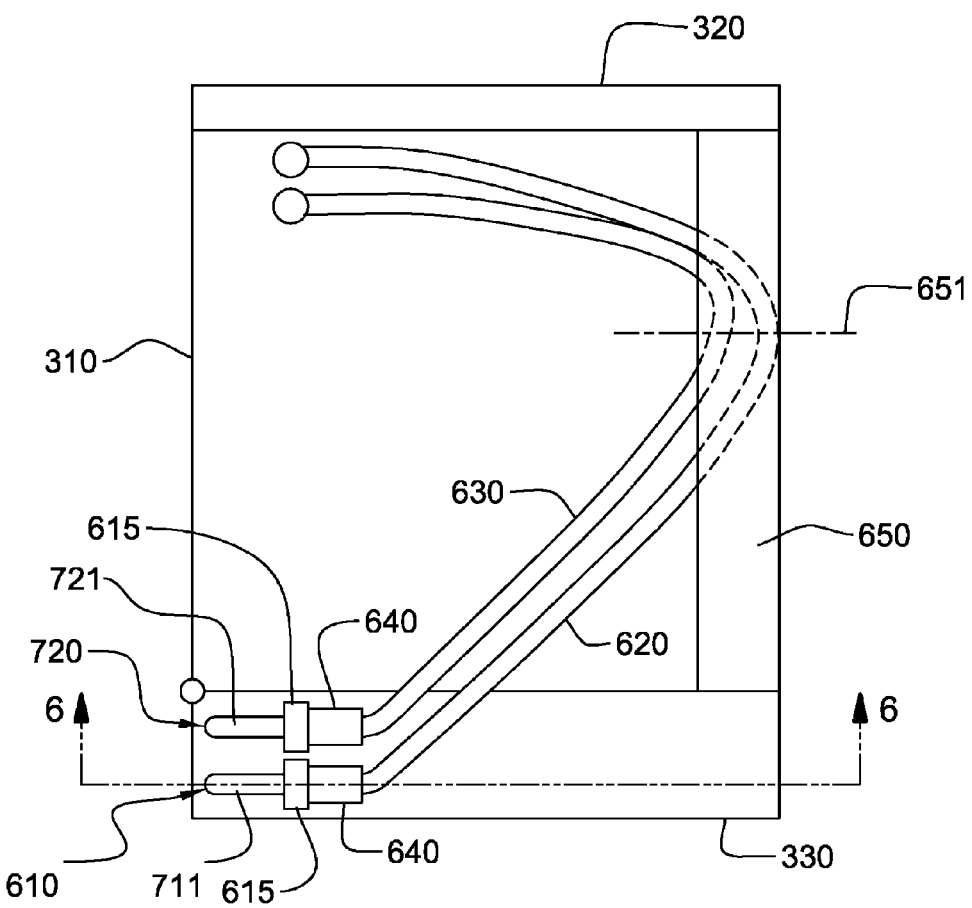
FIG. 7 is a partial cross-sectional, top plan view of the electronics rack and cooling apparatus of FIG. 6, taken along line 7-7 in FIG. 6, in accordance with an aspect of the present invention.

FIGS. 6 & 7 depict one embodiment of an electronics rack with an air-to-liquid heat exchanger mounted to the outlet door thereof. These figures illustrate one embodiment of system coolant supply and return hoses, in accordance with an aspect of the present invention. Referring collectively to both figures, electronics rack 310 again includes an inlet door 320 and an outlet door 330, with outlet door 330 comprising a frame which holds air-to-liquid heat exchanger 340. Outlet door 330 further supports a system coolant inlet plenum 610 and a system coolant outlet plenum 720 disposed behind system coolant inlet plenum 610.

In this example, the system coolant supply header (not shown) and system coolant return header 420 are disposed above a ceiling tile 600 in a data center containing the cooled electronics system illustrated. As shown in FIG. 7, system coolant supply hose 620 and system coolant return hose 630 are employed to couple in fluid communication system coolant inlet plenum 610 and the system coolant supply header (see FIG. 4), and to couple in fluid communication system coolant outlet plenum 720 and system coolant return header 420 (see FIG. 6). In one embodiment, system coolant supply and return hoses 620, 630 are flexible, metallic braided hoses which loop in a U-shape (or in an S-shape) configuration above the top of electronics rack 310, as illustrated in FIG. 7. To ensure a robust system, the system coolant supply and return hoses 620, 630 are, in one embodiment, each soldered, welded or brazed to a respective portion of a connect coupling 615 at a first end and solder, welded or brazed to a respective portion of a connect coupling 616 at a second end, wherein the first ends of the hoses couple to the respective inlet and outlet plenums, and the second ends of the hoses couple to the respective supply and return headers. Similarly, the inlet and outlet plenums are soldered, welded or brazed to a respective portion of a connect coupling 615 and the supply and return headers are soldered, welded or brazed to a respective portion of a connect coupling 616. In one embodiment, each connect coupling 615, 616 is a quick connect coupling, such as the quick connect couplings offered by Parker Hannifin Corporation of Minneapolis, Minn.

Stress-relief structures 640 are coupled to the first ends of system coolant supply and return hoses 620, 630 adjacent to connect couplings 615 to relieve stress on the hoses during opening and closing of outlet door 330. Similarly, stress-relief structures 640 are coupled to the second ends of system coolant supply and return hoses 620, 630 adjacent to connect couplings 616, to alleviate stress on the second hose connections with opening and closing of the outlet door. In one embodiment, these stress-relief structures are joint protector sleeves which slip over the first ends and second ends of the system coolant supply and return hoses, 620, 630 prior to soldering or brazing thereof to the respective connect couplings 615, 616.

Figure 8:
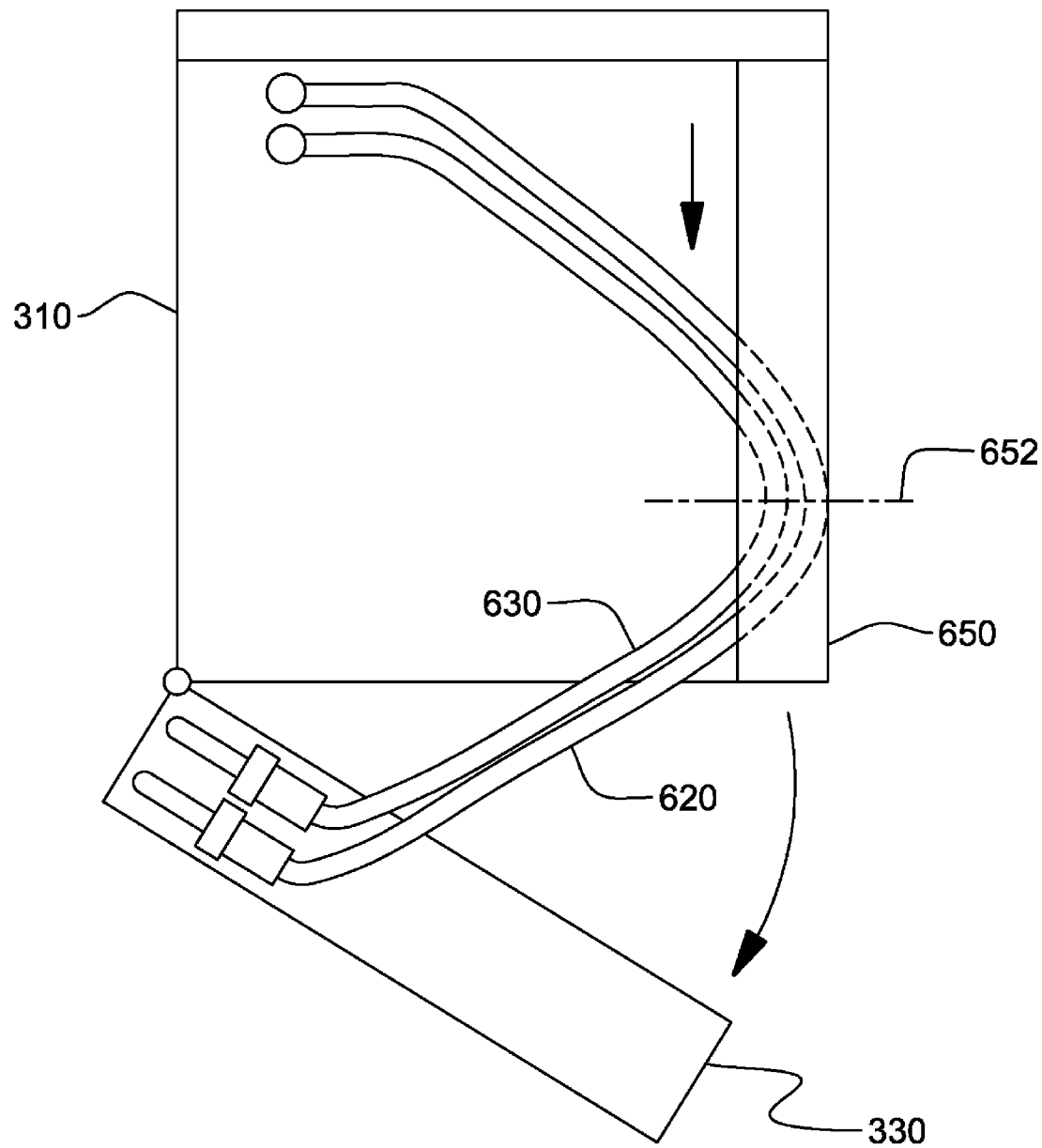
FIG. 8 depicts a partial cross-sectional, top plan view of the electronics rack and cooling apparatus of FIG. 6, illustrating opening of the door and movement of the system coolant supply and return hoses, in accordance with an aspect of the present invention.

As shown, the partially looped supply and return hoses are constrained by an inverted L-shaped rail 650 attached to electronics rack 310 to extend above the top thereof. When outlet door 330 is in closed position (see FIG. 7), the partially looped supply and return hoses are located above the electronics rack 310 at a peak point location 651, and with opening of outlet door 330, the system coolant supply and return hoses 620, 630 move with the door, with the peak point of the hoses moving under inverted L-shaped rail 650 to a location 652, as illustrated in FIG. 8.

In the cooling apparatus embodiment of FIGS. 6 & 7, the system coolant inlet plenum 610 and system coolant outlet plenum 720 each include a right angle bend at the upper portion thereof, which extends a portion of the respective plenum over the top of outlet door 330. In the embodiment illustrated, this results in a horizontal inlet plenum portion 711 and a horizontal outlet plenum portion 721 extending over the top of the outlet door, substantially parallel to the air outlet side of the electronics rack. The coolant inlet to the system coolant inlet plenum 610 is located in horizontal inlet plenum portion 711, and the coolant outlet for the system coolant outlet plenum 720 is located at the horizontal outlet plenum portion 721 thereof, as illustrated in FIG. 7, with the coolant inlet and coolant outlet being connected to a respective connect coupling 615.

Figure 9:
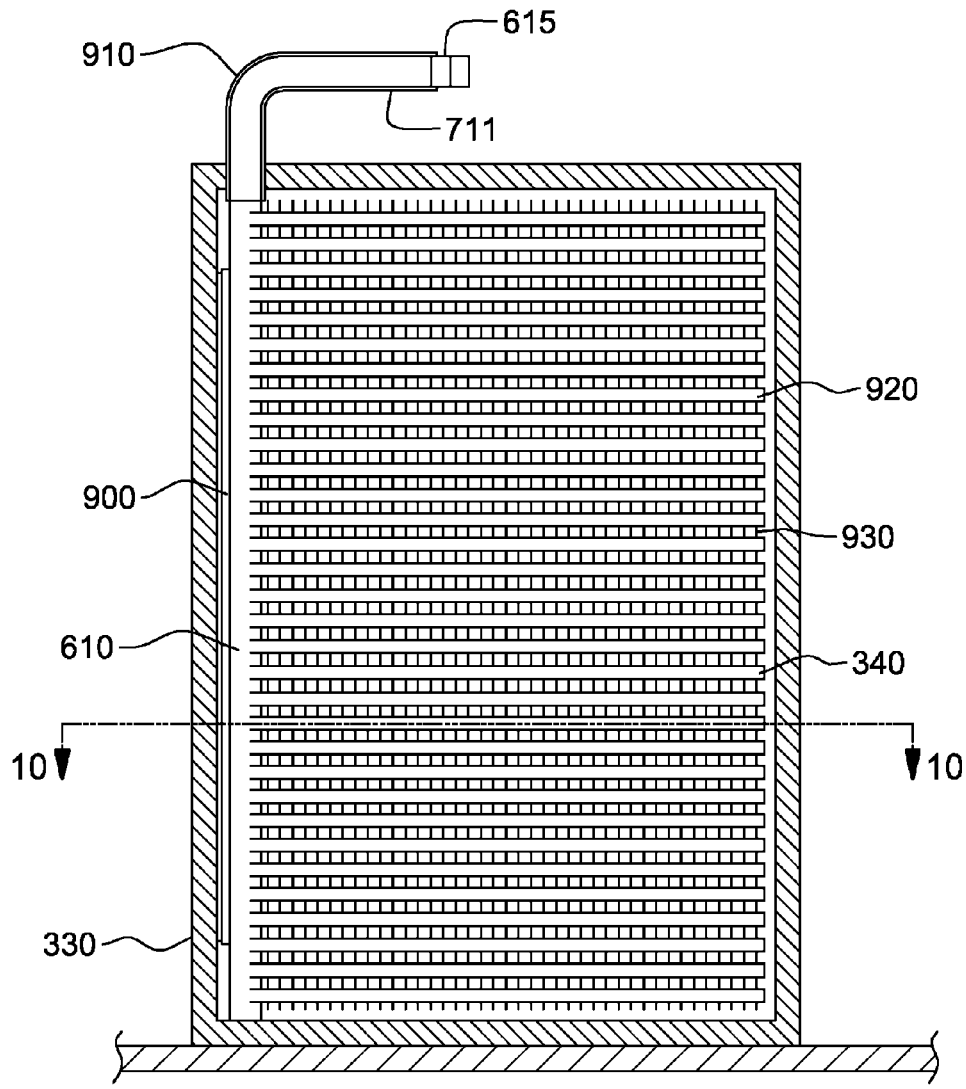
FIG. 9 is a partial cross-sectional elevational view of one embodiment of an electronics rack door and cooling apparatus mounted thereto, taken along line 9-9 in FIG. 10, in accordance with an aspect of the present invention.
Figure 10:
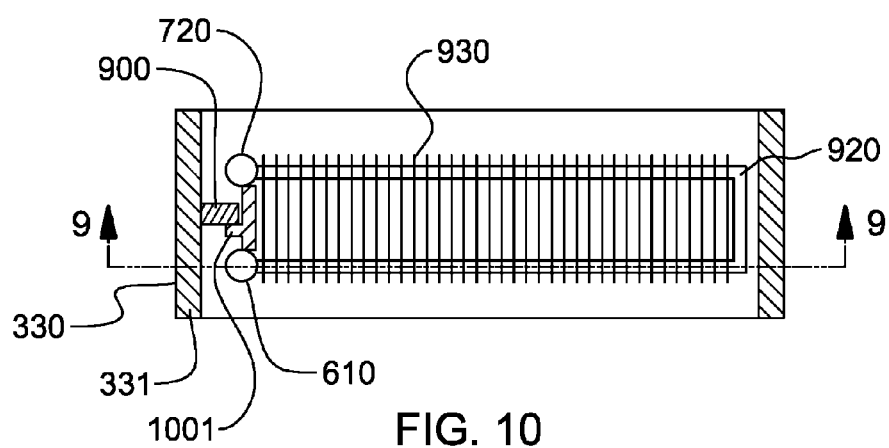
FIG. 10 is a cross-sectional, top plan view of the door and cooling apparatus of FIG. 9, taken along line 10-10 in FIG. 9, in accordance with an aspect of the present invention.

FIGS. 9 & 10 depict one embodiment of outlet door 330 supporting air-to-liquid heat exchanger 340, and system coolant inlet and outlet plenums 610, 720. Referring to both figures collectively, outlet door frame 331 supports a rigid flap 900 which attaches, for example, by brazing or soldering, to a plate 1001 secured between the system coolant inlet plenum 610 and system coolant outlet plenum 720. In FIG. 9, right angle bend 910 is shown disposed at the top of system coolant inlet plenum 610. This right angle bend defines horizontal inlet plenum portion 711, which extends above the top of door 330. As noted, the coolant inlet to system coolant inlet plenum 610 is coupled to a connect coupling 615 for facilitating connection thereof to the respective supply hose as described above. The air-to-liquid heat exchanger comprises a plurality of horizontally-oriented heat exchange tube sections 920. These heat exchange tube sections 920 each comprise a coolant channel having an inlet and outlet, with each coolant channel inlet being coupled to the system coolant inlet plenum 610 and each coolant channel outlet being coupled to the system coolant outlet plenum 720. A plurality of fins 930 are attached to horizontally-oriented heat exchange tube sections 920 for facilitating transfer of heat from air passing across the air-to-liquid heat exchanger to coolant flowing through the plurality of horizontally-oriented heat exchange tube sections. In one embodiment, the plurality of fins are vertically-oriented, rectangular fins attached to the horizontally-oriented heat exchange tube sections 920.

Figure 11:
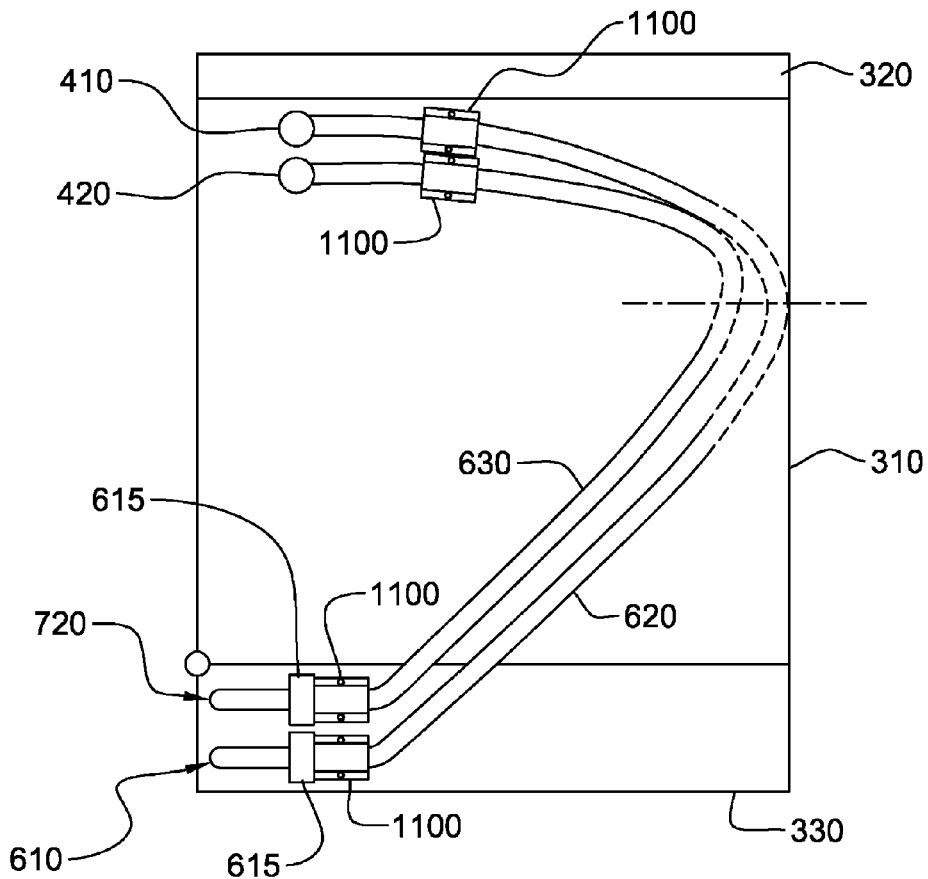
FIG. 11 is a top plan view of an alternate embodiment of an electronics rack and cooling apparatus, wherein a different stress-relief structure is employed adjacent to the first and second hose ends, in accordance with an aspect of the present invention.
Figure 12:
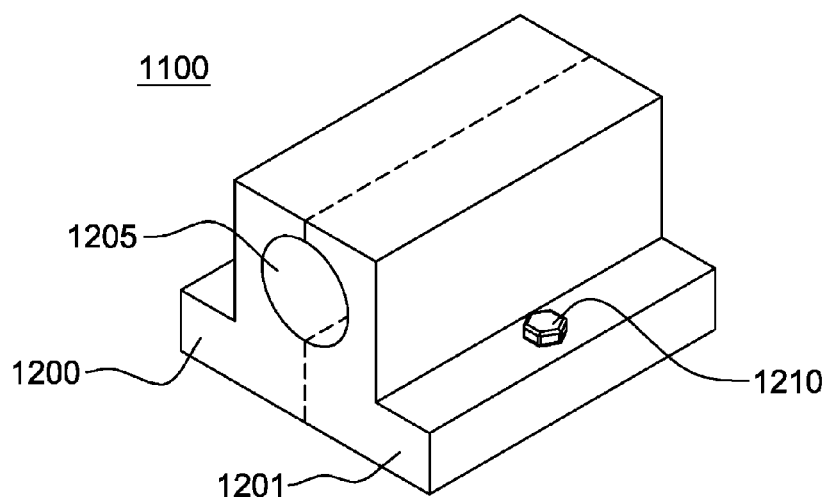
FIG. 12 is an isometric view of one embodiment of the stress-relief structure employed in the electronics rack and cooling apparatus embodiment of FIG. 11, in accordance with an aspect of the present invention.

FIGS. 11 & 12 depict an alternate embodiment of a stress-relief structure for use with system coolant supply and return hoses 620, 630. As illustrated in FIG. 11, supply and return hoses 620, 630 reside over the top of electronics rack 310 and respectively couple a system coolant inlet plenum 610 and system coolant supply header 410, or a system coolant outlet plenum 720 and system coolant return header 420. Electronics rack 310 includes an inlet door 320, and an outlet door 330, which supports an air-to-liquid heat exchanger (in addition to the system coolant inlet plenum 610 and system coolant outlet plenum 720), as described above. Connect couplings 615 are employed to connect in fluid communication a first end of system coolant supply hose 620 and the coolant inlet of system coolant inlet plenum 610, and to connect in fluid communication a first end of system coolant return hose 630 and the coolant outlet of system coolant outlet plenum 720. Adjacent to these connections are respective hose attachment fixtures 1100, one embodiment of which is depicted in FIG. 12.

As shown in FIG. 12, in one embodiment, hose attachment fixture 1100 comprises a first portion 1200 and a second portion 1201, which when assembled about a respective hose (see FIG. 10), form hose attachment fixture 1100. A cylindrical hole 1205 is defined by the first and second portions 1200, 1201, and is sized to accommodate the respective supply or return hose. Attachment means 1210 secure the respective portions 1200, 1201 to the outlet door or electronics rack for fixedly positioning the hose attachment fixture about the respective hose, for example, adjacent to connect couplings 615.

As shown in FIG. 11, a second pair of hose attachment fixtures 1100 are also employed closer to the second ends of the system coolant supply and return hoses 620, 630 for anchoring the hoses near their second ends and relieving stress on the connections of the hoses to the respective supply and return headers 410, 420 resulting from opening or closing of outlet door 330. By employing and positioning hose attachment fixtures 1100 as illustrated in FIG. 11, the inverted L-shaped rail of the cooled electronics system embodiment illustrated in FIGS. 6-8 can be omitted.

Figure 13:
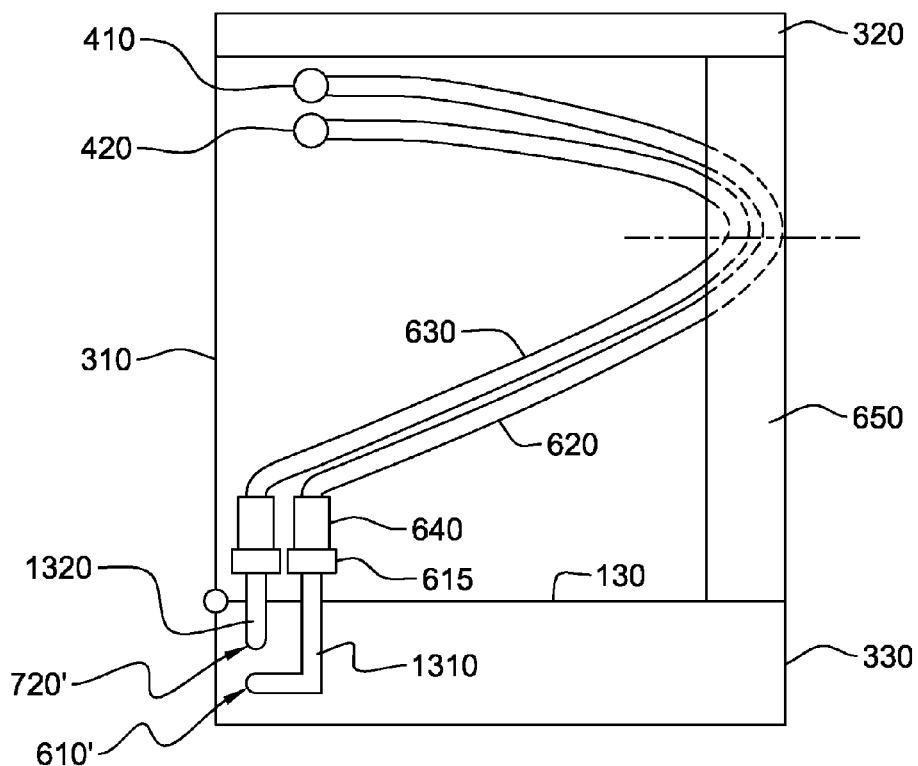
FIG. 13 is a top plan view of an alternate embodiment of an electronics rack and cooling apparatus layout, in accordance with an aspect of the present invention.

FIG. 13 depicts an alternate embodiment of a system coolant inlet plenum 610' and system coolant outlet plenum 720' for a cooling apparatus such as described herein. In this embodiment, electronics rack 310 includes an inlet door 320, and an outlet door 330, which supports the air-to-liquid heat exchanger and system coolant inlet and outlet plenums as described above. System coolant supply hose 620 and system coolant return hose 630 respectively couple the system coolant inlet plenum 610' to the system coolant supply header 410 and the system coolant outlet plenum 720' to the system coolant return header 420. As shown, the supply and return hoses 620, 630 are partially looped, and in this embodiment, form a U-shape above the electronics rack, with the peak point of the hoses being constrained by an inverted L-shaped rail 650. The first ends of system coolant supply and return hoses 620, 630 are coupled 615 to the respective coolant inlet or coolant outlet of the system coolant inlet plenum 610' and system coolant outlet plenum 720'. Stress-relief structures 640 are disposed adjacent to the connect couplings 615. In one embodiment, these stress-relief structures are joint protector sleeves which encircle the respective hose end adjacent to connect couplings 615.

In the embodiment of FIG. 13, the system coolant inlet and outlet plenums include a right angle bend in the top portion thereof such that a horizontal inlet plenum portion 1310 and a horizontal outlet plenum portion 1320 are defined. As shown, the horizontal inlet plenum portion 1310 and horizontal outlet plenum portion 1320 are configured to project towards the electronics rack, over a portion thereof, in a direction transverse to air outlet side 130 of electronics rack 310. This configuration advantageously maintains the system coolant supply and return hoses over the top of electronics rack 310 as outlet door 330 is opened or closed.

Figure 14:
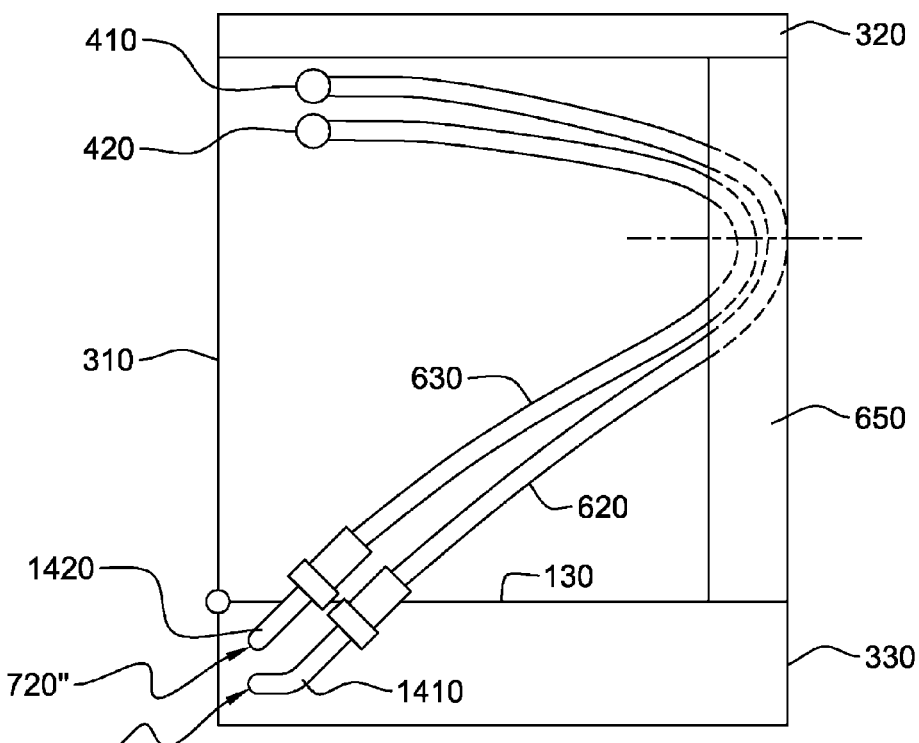
FIG. 14 is a top plan view of another embodiment of an electronics rack and cooling apparatus layout, in accordance with an aspect of the present invention.

FIG. 14 depicts an alternate embodiment of the cooled electronics system, wherein electronics rack 310 includes an inlet door 320 and a hinged outlet door 330, which supports an air-to-liquid heat exchanger, and system coolant inlet and outlet plenums (such as described above). In this example, the top portion of system coolant inlet plenum 610" and of system coolant outlet plenum 720" is configured such that horizontal inlet plenum portion 1410 and horizontal outlet plenum portion 1420 extend, for example, at a 45° angle to the air outlet side 130 of the electronics rack 310 when outlet door 330 is closed. System coolant supply hose 620 couples in fluid communication system coolant inlet plenum 610" and system coolant supply header 410, while system coolant return hose 630 couples in fluid communication system coolant outlet plenum 720" and system coolant return header 420. Further, the partially looped system coolant supply and return hoses 620, 630 are constrained by an inverted L-shaped rail 650 secured to extend above electronics rack 310. Advantageously, by disposing horizontal inlet plenum portion 1410 and horizontal outlet plenum portion 1420 at approximately a 45° angle to the air outlet side 130 of electronics rack 310, less stress on the first ends of the supply and return hoses 620, 630 may result from opening or closing of the outlet door.

Figure 15:
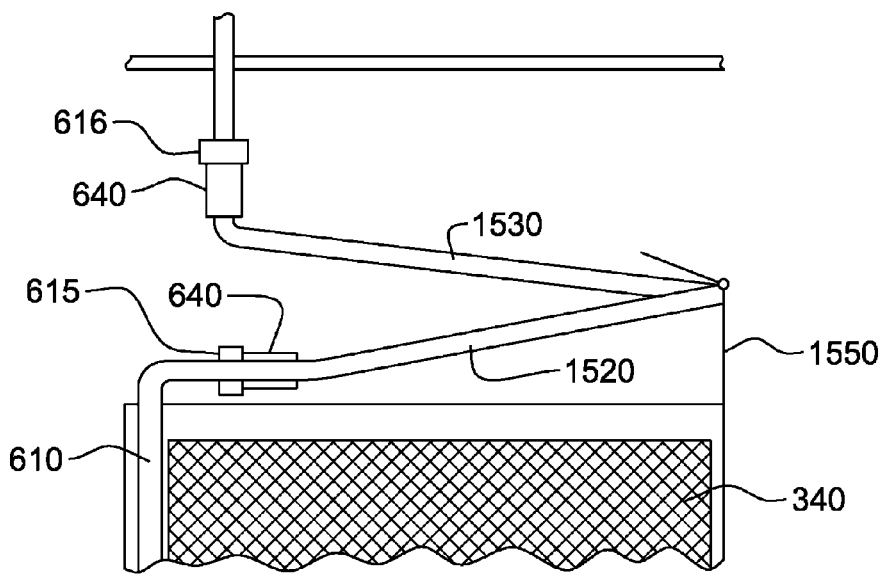
FIG. 15 is a partial elevational view of an alternate embodiment of an electronics rack and cooling apparatus layout, in accordance with an aspect of the present invention.
Figure 16:
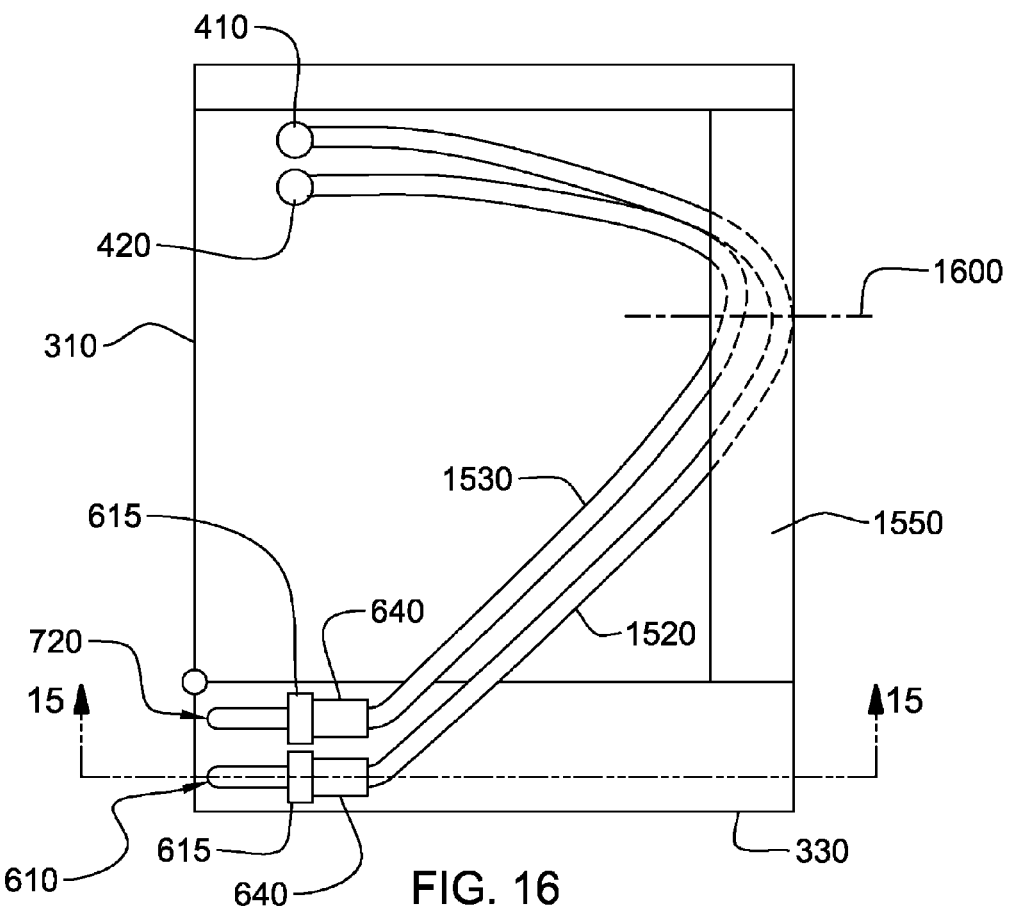
FIG. 16 is a top plan view of the electronics rack and cooling apparatus layout of FIG. 15, showing the door in a closed position, in accordance with an aspect of the present invention.
Figure 17:
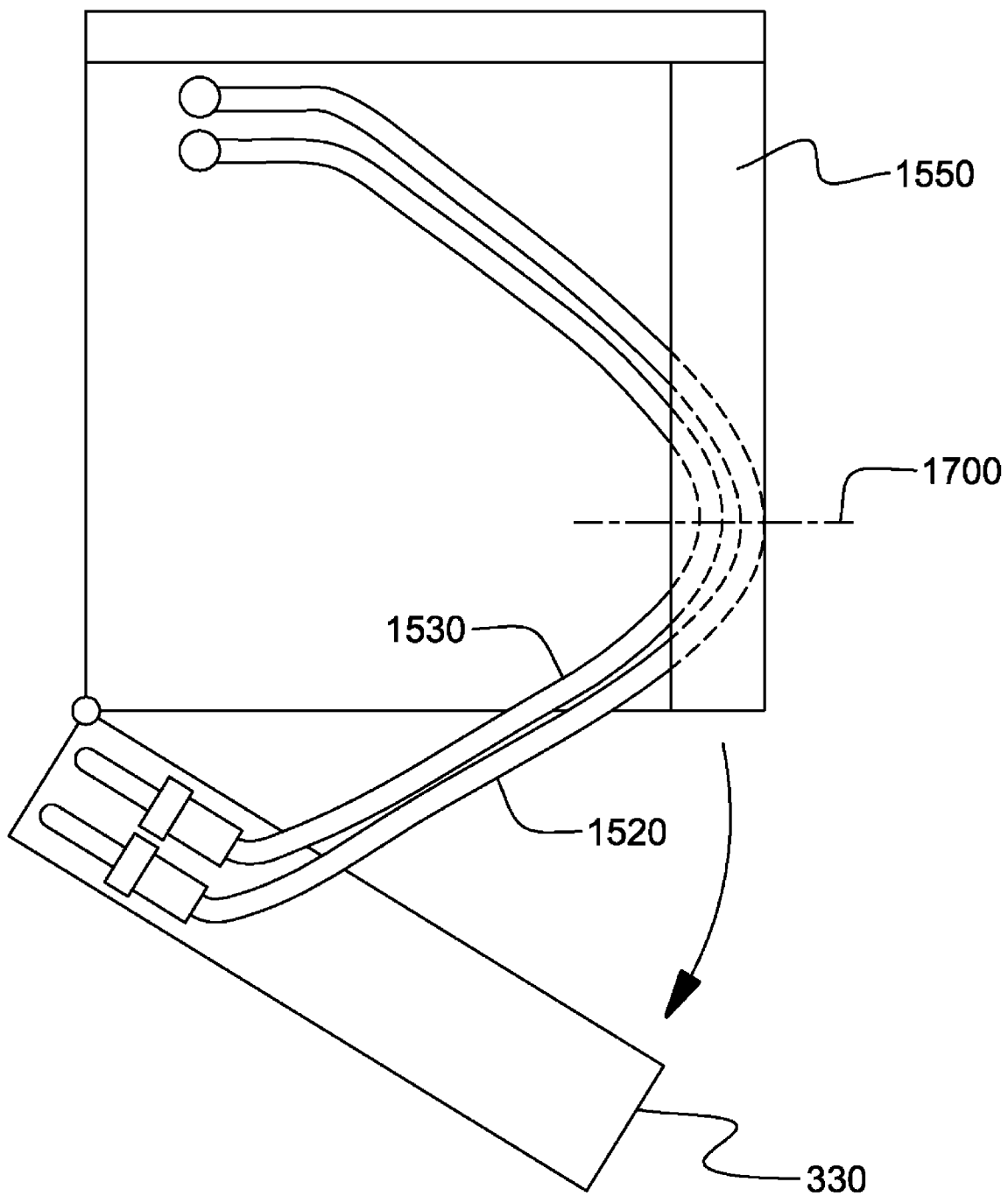
FIG. 17 is a top plan view of the electronics rack and cooling apparatus embodiment of FIGS. 15 & 16, illustrating pivoting opening of the door and movement of the system coolant supply and return hoses over the top of the electronics rack, as directed by the inverted L-shaped rail extending above the top of the rack, in accordance with an aspect of the present invention.

FIGS. 15-17 depict an alternate embodiment of a system coolant supply hose 1520 and system coolant return hose 1530. In this embodiment, hoses 1520, 1530 partially coil in three dimensions above the top of electronics rack 310. Depending on the construction of the supply and return hoses, this three-dimensional coiling embodiment may be desired. For example, if the hoses are semi-rigid, they may tend to naturally coil in three dimensions.

As shown, system coolant supply hose 1520 couples in fluid communication system coolant inlet plenum 610 and system coolant return header 410, while system coolant return hose 1530 couples in fluid communication system coolant outlet plenum 720 and system coolant return header 420. Connect couplings 615 and stress-relief structures 640 are employed at one or both ends of the supply and return hoses. In this embodiment, an angled inverted L-shaped rail 1550 is affixed to electronics rack 310 to partially constrain movement of the partially looped system coolant supply and return hoses. The supply and return hoses translate under angled inverted L-shaped rail 1550 between a retracted peak point position 1600 (FIG. 16) and an extended peak point position 1700 (FIG. 17) with opening and closing of the outlet door 330.

Those skilled in the art will note from the above discussion that although described herein with reference to the air-to-liquid heat exchanger being disposed within the outlet door of the electronics rack, that the air-to-liquid heat exchanger could alternatively be disposed within the inlet door of the electronics rack, along with the system coolant inlet and outlet plenums. Further, although described as a braided metallic hose, the system coolant supply and return hoses could alternatively comprise other hose compositions, such as Teflon®, with the Teflon® hoses being epoxied at their ends to their respective connect couplings.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of an electronics rack, the apparatus comprising:
   an air-to-liquid heat exchanger mounted to a door, the door being vertically, hingedly mounted along one edge to an electronics rack at one of an air inlet side or an air outlet side thereof, wherein air moves through the electronics rack from the air inlet side to the air outlet side;
   a system coolant inlet plenum and a system coolant outlet plenum mounted to the door adjacent to the one edge of the door hingedly mounted to the electronics rack, the system coolant inlet plenum and system coolant outlet plenum being in fluid communication with the air-to-liquid heat exchanger and facilitating passage of system coolant therethrough, the system coolant inlet plenum comprising a coolant inlet at a top portion thereof and the system coolant outlet plenum comprising a coolant outlet at a top portion thereof;
   a system coolant supply hose and a system coolant return hose disposed above the electronics rack, the system coolant supply hose being coupled at a first end to the coolant inlet of the system coolant inlet plenum and at a second end to a system coolant supply header of a data center containing the electronics rack, and the system coolant return hose being coupled at a first end to the coolant outlet of the system coolant outlet plenum and at a second end to a system coolant return header of the data center, wherein the system coolant supply hose and system coolant return hose are each flexible, at least partially looped and of sufficient length to allow for opening and closing of the door, and wherein the system coolant inlet plenum includes an inlet portion extending laterally away from the one edge of the door hingedly mounted to the electronics rack, the coolant inlet residing in the inlet portion of the system coolant inlet plenum, and the system coolant outlet plenum includes an outlet portion extending laterally away from the one edge of the door hingedly mounted to the electronics rack, the coolant outlet residing in the outlet portion of the system coolant outlet plenum; and
   a first stress-relief structure attached to the system coolant supply hose adjacent to the first end thereof, and a second stress-relief structure attached to the system coolant return hose adjacent to the first end thereof, wherein the first and second stress-relief structures relieve stress on couplings at the first ends of the system coolant supply and return hoses, respectively, during opening or closing of the door.

2. The apparatus of claim 1, wherein system coolant is supplied to the system coolant inlet plenum via the system coolant supply hose and system coolant is exhausted from the system coolant outlet plenum via the system coolant return hose, and wherein the system coolant is a two-phase coolant which partially vaporizes within the air-to-liquid heat exchanger when operatively employed to extract heat from air moving through the electronics rack.

3. The apparatus of claim 1, wherein the inlet portion of the system coolant inlet plenum extends at least partially over at least one of a top of the door or a top of the electronics rack, and wherein the outlet portion of the system coolant outlet plenum extends at least partially over at least one of the top of the door or the top of the electronics rack.

4. The apparatus of claim 1, wherein the inlet portion of the system coolant inlet plenum comprises a horizontal inlet portion and the outlet portion of the system coolant outlet plenum comprises a horizontal outlet portion, and wherein the system coolant inlet plenum extends vertically within the door and includes a right angle bend at the top portion thereof, the right angle bend comprising the horizontal inlet portion, which extends at least partially over at least one of a top of the door or a top of the electronics rack, the coolant inlet residing in the horizontal inlet portion of the system coolant inlet plenum, and wherein the system coolant outlet plenum extends vertically within the door and comprises a right angle bend at the top portion thereof, the right angle bend comprising the horizontal outlet portion, which extends at least partially over at least one of the top of the door or the top of the electronics rack, and wherein the coolant outlet is disposed in the horizontal outlet portion of the system coolant outlet plenum.

5. The apparatus of claim 4, further comprising an inverted L-shaped rail affixed to the top of the electronics rack, the inverted L-shaped rail partially directing movement of the system coolant supply hose and system coolant return hose above the electronics rack with opening or closing of the door.

6. The apparatus of claim 4, wherein the door is mounted to the air outlet side of the electronics rack, and wherein the horizontal inlet portion and the horizontal outlet portion each extend over the top of the door parallel to the air outlet side of the electronics rack.

7. The apparatus of claim 4, wherein the door is mounted to the air outlet side of the electronics rack, and wherein the horizontal inlet portion and the horizontal outlet portion each extend partially over the top of the electronics rack when the door is closed in a direction transverse to the air outlet side of the electronics rack.

8. The apparatus of claim 1, further comprising a third stress-relief structure attached to the system coolant supply hose adjacent to the second end thereof, and a fourth stress-relief structure attached to the system coolant return hose adjacent to the second end thereof, wherein the third and fourth stress-relief structures relieve stress on couplings at the second ends of the system coolant supply hose and coolant system return hose, respectively, during opening or closing of the door.

9. The apparatus of claim 8, wherein the first stress-relief structure, second stress-relief structure, third stress-relief structure and fourth stress-relief structure each comprise one of a joint protector sleeve or a hose attachment fixture.

10. The apparatus of claim 9, wherein connect couplings are fixedly secured to the first ends and second ends of the system coolant supply and return hoses, the connect couplings at the first ends of the system coolant supply and return hoses facilitating respective attachment thereof to the coolant inlet of the system coolant inlet plenum and the coolant outlet of the system coolant outlet plenum, and the connect couplings at the second ends of the system coolant supply and return hoses facilitating respective connection thereof to the system coolant supply header and the system coolant return header, and wherein the system coolant supply header and system coolant return header extend within the data center above the electronics rack.

11. A cooled electronics system comprising:
  an electronics rack, the electronics rack comprising:
    an air inlet side and an air outlet side, the air inlet and air outlet sides respectively enabling ingress and egress of external air;
    at least one electronics subsystem requiring cooling;
    at least one air-moving device, the at least one air-moving device being capable of causing external air to flow from the air inlet side of the electronics rack, across the at least one electronics subsystem, to the air outlet side of the electronics rack; and
    an outlet door hingedly mounted along one edge to the electronics rack at the air outlet side of the electronics rack, the outlet door having an opening therein allowing egress of air from the electronics rack;
  a cooling apparatus for facilitating cooling of the electronics rack, the cooling apparatus comprising:
    an air-to-liquid heat exchanger mounted to the door within the opening therein, wherein at least a portion of air egressing from the electronics rack passes across the air-to-liquid heat exchanger;
    a system coolant inlet plenum and a system coolant outlet plenum mounted to the door adjacent to the one edge of the door hingedly mounted to the electronics rack, the system coolant inlet plenum and system coolant outlet plenum being in fluid communication with the air-to-liquid heat exchanger and facilitating passage of system coolant therethrough, the system coolant inlet plenum comprising a coolant inlet at a top portion thereof and the system coolant outlet plenum comprising a coolant outlet at a top portion thereof;
    a system coolant supply hose and a system coolant return hose disposed above the electronics rack, the system coolant supply hose being coupled at a first end to the coolant inlet of the system coolant inlet plenum and at a second end to a system coolant supply header of a data center containing the electronics rack, and the system coolant return hose being coupled at a first end to the coolant outlet of the system coolant outlet plenum and at a second end to a system coolant return header of the data center, wherein the system coolant supply hose and system coolant return hose are each flexible, at least partially looped and of sufficient length to allow for opening and closing of the door, and wherein the system coolant inlet plenum includes an inlet portion extending laterally away from the one edge of the door hingedly mounted to the electronics rack, the coolant inlet residing in the inlet portion of the system coolant inlet plenum, and the system coolant outlet plenum includes an outlet portion extending laterally away from the one edge of the door hingedly mounted to the electronics rack, the coolant outlet residing in the outlet portion of the system coolant outlet plenum; and
    a first stress-relief structure attached to the system coolant supply hose adjacent to the first end thereof, and a second stress-relief structure attached to the system coolant return hose adjacent to the first end thereof, wherein the first and second stress-relief structures relieve stress on couplings at the first ends of the system coolant supply and return hoses, respectively, during opening and closing of the door.

12. The cooled electronics system of claim 11, wherein system coolant is supplied to the system coolant inlet plenum via the system coolant supply hose and system coolant is exhausted from the system coolant outlet plenum via the system coolant return hose, and wherein the system coolant is a two-phase coolant which partially vaporizes within the air-to-liquid heat exchanger when operatively employed to extract heat from air moving through the electronics rack, and the system coolant comprises one of a refrigerant or a dielectric liquid.

13. The cooled electronics system of claim 11, wherein the inlet portion of the system coolant inlet plenum comprises a horizontal inlet portion and the outlet portion of the system coolant outlet plenum comprises a horizontal outlet portion, and wherein the system coolant inlet plenum extends vertically within the door and includes a right angle bend at the top portion thereof, the right angle bend comprising the horizontal inlet portion, which extends at least partially over at least one of a top of the door or a top of the electronics rack, the coolant inlet residing in the horizontal inlet portion of the system coolant inlet plenum, and wherein the system coolant outlet plenum extends vertically within the door and comprises a right angle bend at the top portion thereof, the right angle bend comprising the horizontal outlet portion, which extends at least partially over at least one of the top of the door or the top of the electronics rack, and wherein the coolant outlet is disposed in the horizontal outlet portion of the system coolant outlet plenum.

14. The cooled electronics system of claim 13, further comprising an inverted L-shaped rail affixed to the top of the electronics rack, the inverted L-shaped rail partially directing movement of the system coolant supply hose and system coolant return hose above the electronics rack with opening or closing of the door.

15. The cooled electronics system of claim 11, further comprising a third stress-relief structure attached to the system coolant supply hose adjacent to the second end thereof, and a fourth stress-relief structure attached to the system coolant return hose adjacent to the second end thereof, wherein the third and fourth stress-relief structures relieve stress on couplings at the second ends of the system coolant supply hose and coolant system return hose, respectively, during opening or closing of the door, and wherein the first stress-relief structure, second stress-relief structure, third stress-relief structure and fourth stress-relief structure each comprise one of a joint protector sleeve or a hose attachment fixture.

16. The cooled electronics system of claim 15, wherein connect couplings are fixedly secured to the first ends and second ends of the system coolant supply and return hoses, the connect couplings at the first ends of the system coolant supply and return hoses facilitating respective attachment thereof to the coolant inlet of the system coolant inlet plenum and the coolant outlet of the system coolant outlet plenum, and the connect couplings at the second ends of the system coolant supply and return hoses facilitating respective connection thereof to the system coolant supply header and the system coolant return header, and wherein the system coolant supply header and system coolant return header extend within the data center above the electronics rack.

17. A data center comprising:
a plurality of electronics racks, each electronics rack comprising an air inlet side and an air outlet side, the air inlet and air outlet sides respectively enabling ingress and egress of air through the electronics rack, and each electronics rack further comprising a door hingedly mounted along one edge to one of the air inlet side or air outlet side of the electronics rack; and
a plurality of cooling apparatuses, each cooling apparatus being mounted in part to the door of a respective electronics rack of the plurality of electronics racks, each cooling apparatus comprising:
an air-to-liquid heat exchanger mounted to the door, wherein at least a portion of air egressing from the respective electronics rack passes across the air-to-liquid heat exchanger;
a system coolant inlet plenum and a system coolant outlet plenum mounted to the door adjacent to the one edge of the door hingedly mounted to the electronics rack, the system coolant inlet plenum and system coolant outlet plenum being in fluid communication with the air-to-liquid heat exchanger and facilitating passage of system coolant therethrough, the system coolant inlet plenum comprising a coolant inlet at a top portion thereof and the system coolant outlet plenum comprising a coolant outlet at a top portion thereof;
a system coolant supply hose and a system coolant return hose disposed above the electronics rack, the system coolant supply hose being coupled at a first end to the coolant inlet of the system coolant inlet plenum and at a second end to a system coolant supply header of the data center, and the system coolant return hose being coupled at a first end to the coolant outlet of the system coolant outlet plenum and at a second end to a system coolant return header of the data center, wherein the system coolant supply hose and system coolant return hose are each flexible, at least partially looped and of sufficient length to allow for opening and closing of the door, and wherein the system coolant inlet plenum includes an inlet portion extending laterally away from the one edge of the door hingedly mounted to the electronics rack, the coolant inlet residing in the inlet portion of the system coolant inlet plenum, and the system coolant outlet plenum includes an outlet portion extending laterally away from the one edge of the door hingedly mounted to the electronics rack, the coolant outlet residing in the outlet portion of the system coolant outlet plenum; and
a first stress-relief structure attached to the system coolant supply hose adjacent to the first end thereof, and a second stress-relief structure attached to the system coolant return hose adjacent to the first end thereof, wherein the first and second stress-relief structures relieve stress on couplings at the first ends of the system coolant supply and return hoses, respectively, during opening or closing of the door.

18. The data center of claim 17, wherein system coolant is supplied to the system coolant inlet plenum via the system coolant supply hose and system coolant is exhausted from the system coolant outlet plenum via the system coolant return hose, and wherein the system coolant is a two-phase coolant which partially vaporizes within the air-to-liquid heat exchanger when operatively employed to extract heat from air moving through the electronics rack, and the system coolant comprises one of a refrigerant or a dielectric liquid.

19. The data center of claim 17, wherein the inlet portion of the system coolant inlet plenum comprises a horizontal inlet portion and the outlet portion of the system coolant outlet plenum comprises a horizontal outlet portion, and wherein the system coolant inlet plenum extends vertically within the door and includes a right angle bend at the top portion thereof, the right angle bend comprising the horizontal inlet portion, which extends at least partially over at least one of a top of the door or a top of the electronics rack, the coolant inlet residing in the horizontal inlet portion of the system coolant inlet plenum, and wherein the system coolant outlet plenum extends vertically within the door and comprises a right angle bend at the top portion thereof, the right angle bend comprising the horizontal outlet portion, which extends at least partially over at least one of the top of the door or the top of the electronics rack, and wherein the coolant outlet is disposed in the horizontal outlet portion of the system coolant outlet plenum.

20. The data center of claim 19, further comprising an inverted L-shaped rail affixed to the top of the electronics rack, the inverted L-shaped rail partially directing movement of the system coolant supply hose and system coolant return hose above the electronics rack with opening or closing of the door.

* * * * *